United States Patent [19]

Kane et al.

[11] Patent Number: 5,094,811
[45] Date of Patent: Mar. 10, 1992

[54] METHOD OF MAKING A PRINTED CIRCUIT BOARD

[75] Inventors: Robert P. Kane, Camillus; Bruce E. Kurtz, Marcellus, both of N.Y.

[73] Assignee: Allied-Signal, Morris Township, N.J.

[21] Appl. No.: 815,127

[22] Filed: Dec. 30, 1985

Related U.S. Application Data

[63] Continuation of Ser. No. 534,428, Sep. 21, 1983, abandoned.

[51] Int. Cl.[5] .............................................. G22F 7/00
[52] U.S. Cl. .......................................... 419/8; 419/10; 419/66; 427/96; 427/97; 428/901
[58] Field of Search .................... 419/8, 39, 42, 48, 10, 419/66; 29/825, 829–831, 846, 848; 428/901; 156/901; 427/96, 97

[56] References Cited

U.S. PATENT DOCUMENTS

| | | | |
|---|---|---|---|
| 2,599,710 | 6/1952 | Mathaway | 29/155 |
| 2,963,748 | 12/1960 | Young | 419/8 |
| 3,013,913 | 12/1961 | Croop et al. | 154/43 |
| 3,948,706 | 4/1976 | Schmeckenbecher | 156/89 |
| 4,008,300 | 2/1977 | Ponn | 264/104 |
| 4,183,137 | 1/1980 | Lomerson | 427/97 |
| 4,251,319 | 2/1981 | Bonnie | 156/656 |
| 4,263,341 | 4/1981 | Martyniak | 427/97 |
| 4,290,195 | 9/1981 | Rippere | 427/97 |
| 4,327,124 | 4/1982 | DesMarais | 427/96 |
| 4,378,383 | 3/1983 | Moritz | 427/96 |

FOREIGN PATENT DOCUMENTS

| | | |
|---|---|---|
| 0109084 | 5/1984 | European Pat. Off. . |
| 1404697 | 9/1975 | United Kingdom . |
| 83/01886 | 5/1983 | World Int. Prop. O. . |

Primary Examiner—Stephen J. Lechert, Jr.
Attorney, Agent, or Firm—R. C. Stewart; G. H. Fuchs; D. L. Webster

[57] ABSTRACT

The invention is a method for making an electrically conductive path on the wall of a passage through a substrate. It is especially useful for connecting electrically conductive paths (25) on opposite sides of a circuit board (20). The method is characterized by the steps of forming a tapered passage (21) through the substrate (20) that connects to at least one conductive path on each side of the substrate (20), filling the tapered passage (21) with an electrically conductive powder (10), applying pressure with a tapered die (30) to compact the powder (11) against the wall of the passage (21) without blocking the passage, and then heating the compacted powder (11) to a temperature that increases the conductivity and ductility of the compacted powder (11) and its adhesion to the substrate (20) without adversely affecting the shape or condition of the substrate (20).

10 Claims, 1 Drawing Sheet

METHOD OF MAKING A PRINTED CIRCUIT BOARD

This application is a continuation of application Ser. No. 534,428, filed Sept. 21, 1983, abandoned.

This invention relates to a printed circuit board and more particularly to a dry additive process for applying an electrically conductive material to the wall of a passage through a circuit board.

Electrical instrumentation utilizes circuit boards for connecting together the components of its circuitry. Each circuit board is comprised of a dielectric substrate having on one or both sides a plurality of electrically conductive paths, arranged in a predetermined manner, to connect together circuit elements mounted to the substrate. A conductive path on each side of the substrate may be connected together by one or more conductors traversing the edge of the board between the sides or by a metal eyelet located in a hole in the board. One example of a circuit board with metal eyelets may be found in U.S. Pat. No. 3,731,252 entitled "Printed Circuit Board Connector" and issued May 1, 1973. The conductive paths may be placed on the substrate by the application of a metal conductor to the substrate and the subsequent removal of portions of the conductor by liquid chemicals or by depositing an electrical conductor on the substrate with chemical plating baths. Examples of other methods of making circuit boards may be found in U.S. Pat. No. 4,327,124 entitled "Method for Manufacturing Printed Circuits Comprising Printing Conductive Ink on Dielectric Surface" issued Apr. 27, 1982; and U.S. Pat. No. 3,013,913 entitled "Molded Printed Circuit," issued Dec. 19, 1961. In all of the methods involving chemicals, wastes are a problem as the wastes must be disposed of without adversely affecting our environment. Further, the methods using chemicals are expensive and relatively complex. In existing methods that apply heat and pressure to a metallic powder and a moldable substrate to obtain a conductive path, the resulting conductive path has material from the substrate dispersed within the conductor lowering the conductivity of the resulting conductive path. This is not acceptable for certain circuit board applications. Further, using metal eyelets to connect conductive paths on opposite sides of a circuit board requires an extra step in the manufacturing process and hence increases the cost of making the board.

DISCLOSURE OF THE INVENTION

This invention is a method for connecting together the electrically conducting paths on opposite sides of a circuit board. The invention is characterized by the steps of forming a tapered passage through a circuit board that connects t-o a conductive path on each side of the circuit board, filling the passage in the substrate with an electrically conductive powder, applying pressure with a tapered die to compact the powder in the passage of the substrate without blocking the passage, and then heating the compacted powder to its isothermal annealing temperature to increase the conductivity and ductility of the compacted powder and its adhesion to the substrate without adversely affecting the shape or condition of the substrate. The heating step may be omitted when the compacted powder is a metal such as tin.

Accordingly, it is an advantage of this invention to provide a simple method of connecting together conductive paths on opposite sides of a substrate.

An advantage of the method is that it does not require the use of chemicals and hence eliminates chemical wastes, which if not treated properly would provide a hazard to our environment.

Still another advantage of the invention is that it reduces the complexity and expense of manufacturing a circuit board.

A further advantage of the invention is that it provides a method of providing a tubular conductive path through a substrate.

A still further advantage of the invention is that the conductive paths on a circuit board and the conductive passages through a circuit board may be made in one operation.

DETAILED DESCRIPTION OF THE INVENTION

Figure 1:
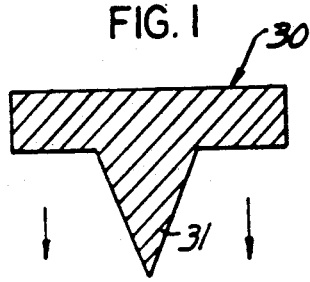
FIGS. 1 through 4 illustrate a method of applying pressure, by a die 30 having a tapered portion 31 to an electrically conductive powder 10 in a tapered passage 21 of a substrate 20 to compact the powder 11 against the wall of the passage 21.
Figure 2:
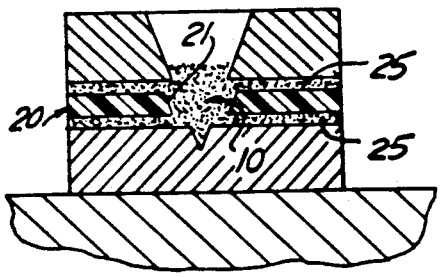
Figure 2:
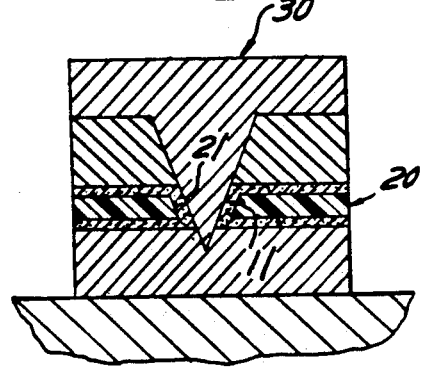
Figure 3:
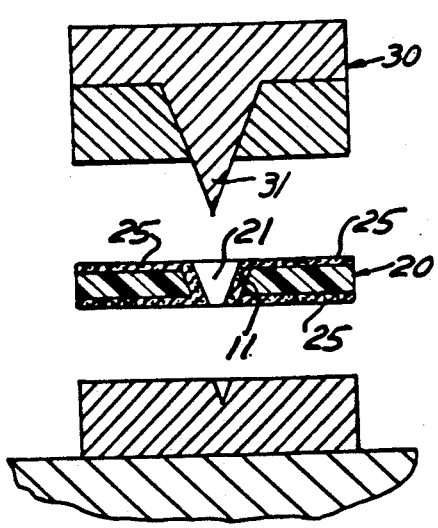
Figure 4:
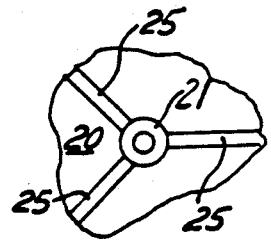

The following are the steps of the method that incorporate the principles of this invention.

Step 1 is the forming of at least one tapered passage 21 through a substrate 20 having conductive paths 25 on opposite sides of the substrate 20. The tapered passage 21 may be made by injection molding or by stamping the substrate with a die to form the passage. The tapered passage 21 is located so as to connect to predetermined conductive paths 25 on opposite sides of the substrate 20. A preferable material for such a substrate would be a plastic such as polyetherimide. Other dielectric materials such as a glass filled plastic or a ceramic may be used.

Step 2 is the filling or over filling of the passage 21 through the substrate 20 with an electrically conductive powder 10. The electrically conductive powder 10 may be a metal or metal alloy such as a copper electrolytic dust which has a particle size less than about 100 microns and is flaky and irregularly shaped.

Step 3 is the application of pressure with a die 30 having a tapered portion 31 to the electrically conductive powder 10 to compact powder 11 against the wall of the tapered passage 21 without blocking the passage. Spreading additional powder 10 and compacting it may be accomplished if a thicker compacted powder 11 is desired. The pressure applied may vary depending upon the materials chosen for the conductive powder 10 and the substrate 20. Preferably, the pressure applied is the highest pressure possible that can be applied to the electrically conductive powder 10 without adversely affecting the substrate 20. Such adverse effects would include fracturing of the substrate or the bending or warping of the substrate so that it is not acceptable for use as a circuit board. When a plastic substrate and a copper electrolytic dust are used a pressure of about 20,000 to 55,000 psi at room temperature will achieve the desired result. Such a pressure range is sufficient to cold work the metal particles of the powder to increase the bulk density of the resulting compacted particles.

Step 4 is the heating of the compacted powder 11 in the passage 21. Depending on the type of conductive powder and substrate material 20 used, the temperature should be sufficient to increase the conductivity and ductility of the compacted powder 11 and its adhesion to the substrate 20 without adversely affecting the substrate, e.g., warping, bending or cracking. Preferably, the compacted powder is heated to a temperature at about the isothermal annealing temperature of the compacted powder for a period of 20 to 60 minutes. For a copper electrolytic dust this temperature is about 200 degrees centigrade. This temperature is acceptable when the substrate material is a plastic such as polyetherimide and prevents the dispersion of the substrate material into the final conductive path except at the interface between the conductive path and substrate. The heating step may be accomplished in an oven or with a heated die. In some instances where a powdered metal such as tin is used to make a conductive path, applying pressure to compact the tin is sufficient to provide the conductive path without the need to heat the compacted powder. For tin a pressure above 10,000 psi will be sufficient to compact the powder.

Alternately, the conductive paths 11, 25 on and through the circuit board may be made at the same time. For example, the grooves and passages would be injection molded into the substrate 20, both filled with a powdered metal, compacted and then heated.

Having described the invention, what is claimed is:

1. A method of making a circuit board from a substrate said circuit board having at least one conductive path on at least one side thereof and having at least one conductive passage therethrough in electrical conduction with at least one of said path, said method comprising the steps of:
    forming a tapered passage through the substrate and at least one groove on at least one side of the substrate with at least one groove connected to said tapered passage;
    filling the passage and the groove on at least one side with an electrically conductive metal powder;
    applying pressure with a die having a tapered portion to compact the metal powder against the wall of the tapered passage without blocking the passage and compact the metal powder in the groove; and
    heating the compacted powder to about its isothermal annealing temperature.

2. The method as described in claim 1 wherein the step of applying pressure to compact the powder comprises:
    applying the maximum pressure possible to the powder and substrate which can be applied without affecting the substrate in a manner such that it would not be acceptable for use as a circuit board.

3. The method as described in claim 1 wherein the pressure applied is about 20,000 to 55,000 psi at room temperature.

4. The method as described in claim 2 wherein the pressure applied is about 20,000 to 55,000 psi at room temperature.

5. The method as described in claim 1 wherein the electrically conductive powder is a copper electrolytic dust and the temperature to which the compacted powder is heated is of about 200 degrees centigrade for a period of 20 to 60 minutes.

6. The method as described in claim 2 wherein the electrically conductive powder is a copper electrolytic dust and the temperature to which the compacted powder is heated is of about 200 degrees centigrade for a period of 20 to 60 minutes.

7. The method as described in claim 1 wherein the conductive powder is tin.

8. The method as described in claim 7 wherein the pressure applied is above 10,000 psi at room temperature.

9. The method as described in claim 3 wherein the electrically conductive powder is a copper electrolytic dust and wherein the compacted powder is heated to a temperature of about 200 degrees centigrade for a period of 20 to 60 minutes.

10. The method as described in claim 4 wherein the electrically conductive powder is a copper electrolytic dust and wherein the compacted powder is heated to a temperature of about 200 degrees centigrade for a period of 20 to 60 minutes.

* * * * *